United States Patent [19]
Furihata et al.

[11] Patent Number: 5,859,155
[45] Date of Patent: Jan. 12, 1999

[54] ADHESIVE OF EPOXY RESIN, CARBOXYLATED RUBBER AROMATIC AMINE AND DICYANDIAMIDE

[75] Inventors: Toshikazu Furihata; Akio Ikeda; Wataru Soejima, all of Ichihara, Japan

[73] Assignee: Mitsui Chemicals, Inc., Tokyo, Japan

[21] Appl. No.: 858,807

[22] Filed: May 19, 1997

Related U.S. Application Data

[63] Continuation of Ser. No. 449,114, May 24, 1995, abandoned.

[30] Foreign Application Priority Data

May 24, 1994 [JP] Japan ................................. 6-109920

[51] Int. Cl.$^6$ .......................... C08K 03/10; C08L 13/00; C08L 63/02
[52] U.S. Cl. .......................... 525/531; 523/457; 523/428; 525/113; 525/502; 525/527; 525/530; 525/531
[58] Field of Search .................... 525/113, 502, 525/527, 530, 531; 523/457, 428

[56] References Cited

U.S. PATENT DOCUMENTS

| | | | |
|---|---|---|---|
| 3,947,522 | 3/1976 | Shelley, Jr. et al. | 525/113 |
| 4,465,542 | 8/1984 | Furihata et al. | 523/428 |
| 4,482,660 | 11/1984 | Minamisawa et al. | 525/113 |
| 4,559,395 | 12/1985 | Jackson | 528/102 |
| 4,891,408 | 1/1990 | Newman-Evans | 525/113 |
| 5,089,560 | 2/1992 | Gardner et al. | 525/113 |
| 5,260,130 | 11/1993 | Sakaguchi et al. | 525/113 |

FOREIGN PATENT DOCUMENTS

| | | |
|---|---|---|
| 58-83031 | 5/1983 | Japan . |
| 60-079079 | 5/1985 | Japan . |
| 4-110369 | 4/1992 | Japan . |
| 4-171753 | 6/1992 | Japan . |
| 4-222840 | 8/1992 | Japan . |
| 5-51433 | 3/1993 | Japan . |
| 5287255 | 11/1993 | Japan . |

*Primary Examiner*—Robert E. Sellers
*Attorney, Agent, or Firm*—Birch, Stewart, Kolasch & Birch, LLP

[57] ABSTRACT

There is provided an adhesive composition for use in a flexible printed circuit board, comprising:

(a) an epoxy resin having substantially at least two epoxy groups per molecule;

(b) at least one selected from carboxyl group-containing nitrile rubber and carboxyl group-containing hydrogenated nitrile rubber; and (c) a curing agent which comprises aromatic amine having substantially at least two primary amino groups per molecule (c1) and dicyandiamide (c2), the molar ratio of the aromatic amine (c1) to the dicyandiamide (c2) being $35/65 \leq (c1)/(c2) \leq 99/1$.

10 Claims, No Drawings

2

ADHESIVE OF EPOXY RESIN, CARBOXYLATED RUBBER AROMATIC AMINE AND DICYANDIAMIDE

This application is a continuation of application Ser. No. 08/449,114 filed on May 24, 1995, now abandoned.

BACKGROUND OF THE INVENTION

1. Field of the Invention

This invention relates to an adhesive composition for use in a flexible printed circuit board and a flexible printed circuit board by using the adhesive composition. More specifically, it relates to an adhesive composition which provides excellent adhesion strength between a base film and a copper foil and between a copper foil and a cover lay sheet and which can give a flexible printed circuit board having excellent soldering heat resistance; and to a flexible printed circuit board having the above excellent properties.

2. Prior Art

A flexible printed circuit board (sometimes abbreviated as FPC hereinafter) which is thin and lightweight and allows of three-dimensional packaging is becoming indispensable to electronic equipment which is increasingly becoming smaller in size, lighter in weight and higher in density in recent years.

Meanwhile, FPCs are also becoming higher in density and production of four to six layer FPCs is now possible. Because of this, FPC production process are becoming more and more complicated.

Both gloss surface and mat surface of a copper foil used in an FPC are generally subjected to a rustproof treatment. Since the copper foil comes in contact with various chemicals as the production process becomes more complicated, a rustproof coating film on the gloss surface of the copper foil, in particular, may be sometimes lost.

Or, there are cases where the rustproof coating film is removed so as to plate a through-hole or the like with copper. The copper surface from which the rustproof coating film has been removed is extremely chemically unstable and is easily corroded due to the presence of oxygen and carbon dioxide when it is exposed to humid air. When a copper circuit having corroded surfaces is covered with a cover lay sheet formed of a heat resistant film provided with an adhesive, reliabilities of adhesion strength and soldering heat resistance which are important properties for FPCs greatly decline. Therefore, when a copper circuit having no rustproof coating film is to be covered with a cover lay sheet, the surface of the copper circuit needs to be polished or softly etched to form a fresh copper surface.

Furihata, one of the co-inventors of the present invention, has already proposed adhesive compositions containing an epoxy resin, a carboxyl group-containing nitrile rubber and a curing agent (see U.S. Pat. No. 4,465,542, JP-A-60-79079 and JP-A-5-287255).

The adhesive compositions proposed by Furihata use an aromatic diamine, dicyandiamide, acid anhydride or imidazole derivative as the curing agent. However, it is not proposed that both an aromatic diamine and dicyandiamide are used in a specific ratio.

The adhesive compositions proposed by Furihata can bond a copper foil circuit having a rustproof coating film to a cover lay sheet with excellent adhesion strength and exhibit excellent soldering heat resistance after adhesion. However, it is desired that adhesive compositions can also bond a copper foil circuit without a rustproof coating film to a cover lay sheet while maintaining excellent adhesion strength and excellent soldering heat resistance, as described above, even if the copper surface is clean.

SUMMARY OF THE INVENTION

An object of the invention is therefore to provide an adhesive composition for use in a flexible printed circuit board.

Another object of the invention is to provide an adhesive composition which can bond not only a mat surface of a copper foil and a gloss surface of a copper foil having a rustproof coating film but also a gloss surface of a copper foil having no rustproof coating film to a cover lay sheet with highly reliable adhesion strength.

Another object of the invention is to provide an adhesive composition which can provide a laminate-having excellent soldering heat resistance obtained by bonding a gloss surface of a copper foil having no rustproof coating film to a cover lay sheet.

Still another object of the invention is to provide an adhesive composition which can maintain a B-stage state of an adhesive layer on a cover lay sheet to be bonded for a prolonged time i.e., an adhesive composition which is excellent in storage stability.

Further, another object of the invention is to provide a flexible printed circuit board having excellent soldering heat resistance.

The above objects and advantages of the invention can be attained first by an adhesive composition for use in a flexible printed circuit board, which comprises (a) an epoxy resin having substantially at least two epoxy groups per molecule, (b) at least one selected from carboxyl group-containing nitrile rubber (b-1) and carboxyl group-containing hydrogenated nitrile rubber (b-2), and (c) a curing agent which comprises an aromatic amine having substantially at least two primary amino groups per molecule (c1) and dicyandiamide (c2), the molar ratio of the aromatic amine (c1) to the dicyandiamide (c2) being $35/65 \leq (c1)/(c2) \leq 99/1$; and secondly by a flexible printed circuit board comprising a base film and a copper circuit bonded to the base film via an adhesive layer formed by curing the above adhesive composition.

Other objects and advantages of the invention will become more apparent from the following detailed description of the invention.

DETAILED DESCRIPTION OF THE INVENTION

As the epoxy resin (a) used in the present invention, an epoxy resin having substantially at least two epoxy groups per molecule is used. The epoxy resin (a) may have molecules having one epoxy group in one molecule or molecules having no epoxy group due to its production process, for example. The total amount of such molecules in the epoxy resin (a) is preferably not more than 4% by weight, more preferably not more than 2% by weight.

Illustrative examples of the epoxy resin (a) include (a-1) epoxy resins of polyglycidyl ethers of polyphenolic compounds such as 2,2-bis(4-oxyphenyl)propane (bisphenol A), 2,2-bis(4-hydroxyphenyl)butane (bisphenol B), 1,1-bis(4-hydroxyphenyl)ethane (bisphenol AD), bis(4-hydroxyphenyl)methane (bisphenol F), 1,1,2,2-tetrakis(4-hydroxyphenyl)ethane and novolak;

(a-2) epoxy resins of polyglycidyl ethers of polyhydric phenols such as catechol, resorcin, hydroquinone and phloroglucinol;

(a-3) epoxy resins of polyglycidyl ethers of aromatic ring hydrogenated compound of the above polyphenolic compounds or polyhydric phenols;

(a-4) brominated epoxy resins of polyglycidyl ethers of brominated compound of the above polyphenolic compounds, polyhydric phenols or aromatic ring hydrogenated compounds of the former two;

(a-5) epoxy resins having an alicyclic skeleton such as vinylcyclohexane dioxide, limonene dioxide and dicyclopentadiene dioxide;

(a-6) epoxy resins of polyglycidyl esters of polycarboxylic acids such as phthalic acid and cyclohexane-1,2-dicarboxylate;

(a-7) epoxy resins formed of polyglycidyl amines of polyamines such as diaminodiphenylmethane, paraaminophenol, and m-xylylenediamine, and (a-8) epoxy resins of polymethylglycidyl ethers of the above polyphenolic compounds, the above polyhydric phenols, the above aromatic ring hydrogenated compounds of the former two, the above brominated compounds of the former three and the above polyamines and methylglycidyl esters of the polycarboxylic acids.

These epoxy resins (a) may be used alone or in combination. Among the epoxy resins (a) above, preferred are (a-1) epoxy resins of glycidyl ethers of polyphenols and brominated epoxy resins thereof.

The epoxy equivalent of the epoxy resin (a) is preferably in the range of 80 to 2,000, more preferably 100 to 1,000.

The carboxyl group-containing nitrile rubber (b-1) as the component (b) is known per se, and is obtained by introducing a carboxyl group into a copolymer rubber of acrylonitrile and conjugated diene having 4 to 8 carbon atoms, preferably 4 to 6 carbon atoms. The molar ratio of unit derived from the acrylonitrile to unit derived from the conjugated diene is preferably in the range of 15/85 to 40/60, more preferably 20/80 to 35/65. The content of units having a carboxyl group is preferably in the range of 1 to 8 mol %, more preferably 2 to 6 mol %.

Methods for introducing the carboxyl group into the copolymer include one in which a terminal group of the copolymer rubber formed from acrylonitrile and conjugated diene is carboxylated by a polymer reaction, one in which carboxyl group-containing monomers such as acrylic acid and methacrylic acid are terpolymerized when the copolymer rubber is produced by copolymerization and the like.

Specific examples of the conjugated diene include 1,3-butadiene, isoprene, 1,3-pentadiene, 1,3-hexadiene and the like, among which 1,3-butadiene and isoprene are preferred.

As the carboxyl group-containing nitrile rubber (b-1), commercially available products can be used. Such products include Hycar CTBN, Hycar CTBNX and Hycar-1072 (trade names) manufactured by Goodrich Co., NIPOL1072 (trade name) manufactured by Nippon Zeon Co., Ltd, Chemigam 550 (trade name) manufactured by Francaise Goodyear Co., and Tilac 221A and Tilac 211A (trade names) manufactured by Standard Franz Co.

The carboxyl group-containing hydrogenated nitrile rubber (b-2) as the component (b) is obtained by hydrogenating all or part of double bonds derived from the conjugated diene of the above carboxyl group-containing nitrile rubber. Preferably, the carboxyl group-containing hydrogenated nitrile rubber (b-2) exhibits an iodine value of 0 to 50 g/100 g. The carboxyl group-containing hydrogenated nitrile rubber (b-2) can be used advantageously because it is superior in heat resistance to the unhydrogenated carboxyl group-containing nitrile rubber (b-1). The carboxyl group-containing hydrogenated nitrile rubbers (b-2) may be used alone or in combination of different kinds. The carboxyl group-containing nitrile rubber (b-1) and the carboxyl group-containing hydrogenated nitrile rubber (b-2) may be used in combination.

The carboxyl group-containing hydrogenated nitrile rubber (b-2) is commercially available and such marketing products can be used as component (b) of the composition of the present invention. Commercially available products include ZetPol (trade name) manufactured by Nippon Zeon Co., Ltd.

The molar ratio of units derived from the acrylonitrile to units derived from the conjugated diene, the content of unit having a carboxyl group and the kinds of the conjugated diene described for the carboxyl group-containing nitrile rubber (b-1) including preferred aspects thereof can be applied to those of the carboxyl group-containing hydrogenated nitrile rubber (b-2).

The Mooney viscosity ($ML_{1+4}$, 100° C.) of the carboxyl group-containing hydrogenated nitrile rubber (b-2) as the component (b) is preferably in the range of 40 to 150, more preferably 45 to 120. The Mooney viscosity of the non-hydrogenated carboxyl group-containing nitrile rubber (b-1) is preferably in the range of 40 to 80, more preferably 42 to 60. When the Mooney viscosity is within the above range, the tackiness of an adhesive layer in a B-stage state is low, so that the handling property, for example, of the cover lay sheet having the adhesive layer is excellent, and an adhesive solution can be easily prepared from the adhesive composition of the present invention due to its excellent solubility in a solvent.

Out of the components (b), those having a weight-average molecular weight of not more than 5,000 are generally liquid at room temperature. Therefore, when the adhesive composition of the present invention prepared by using a low molecular weight component (b) is applied to a heat resistant film as a cover lay sheet to form an adhesive layer of B-stage state. Such adhesive layer undesirably exhibits a strong tackiness. Further, when a copper foil and a base film or a cover lay sheet are pressed and bonded together with a laminator or a press to form a laminate, the adhesive layer in the B-stage state tends to become a fluid. Therefore, an adhesive composition is prepared by reacting a low molecular weight component (b) with an epoxy resin (a) slightly in advance to solidify the adhesive composition, or by using a higher molecular weight component (b) together with the low molecular weight component (b), whereby the strong tackiness of the adhesive layer in the B-stage state can be weakened and the fluidization of the adhesive layer during lamination can be prevented.

The adhesive composition of the present invention contains an aromatic amine (c1) having substantially at least two primary amino groups per molecule and dicyandiamide (c2) as curing agents (c).

The above aromatic amine (c1) may have molecules having one primary amino group in one molecule or molecules having no primary amino group due to the production process. The total amount of such molecules in the aromatic amine (c1) is preferably not more than 10% by weight, more preferably not more than 5% by weight.

The production process for a flexible printed circuit board comprises the step of bonding a copper foil to a base film and the step of bonding a surface of a copper foil circuit to a cover lay sheet. Kinds of the aromatic amine (c1) can be used according to the degree of stability of an adhesive required in each of the steps. In the step of bonding the copper foil to the base film, it is sufficient that a pot life of an adhesive used is several hours to one day. Therefore, a wide range of aromatic amines including those having high reactivity with an epoxy resin and those having low reactivity with an epoxy resin can be used as the aromatic amine (c1).

Meanwhile, in the step of bonding the cover lay film to the surface of the copper foil circuit, the aromatic amine (c1) is desired not to react with the epoxy resin (a) at room temperature as much as possible because the adhesive layer applied to the cover lay sheet needs to be brought into a B-stage state and then stored for a long time.

Illustrative examples of the aromatic amine (c1) are given below. Preferred examples of the aromatic amine (c1) which are highly reactive and preferably used in an adhesive for bonding a copper foil to a base film include diaminodiphenylmethane, 4,4'-diamino-2,2'-dichlorodiphenylmethane, o-, m- or p-phenylenediamine, condensates of aniline and formaldehyde, diaminodiphenyl ether, diaminodiphenyl sulfide, 2,2-bis(diaminodiphenyl)propane, 4,4'-diamino-3,3'-diethyl-5,5'-dimethyldiphenylmethane, and the like. They may be used alone or in combination.

Illustrative examples of the aromatic amine (c1) having low reactivity at room temperature and suitable for use in an adhesive for bonding a copper foil to a base film and an adhesive for bonding a cover lay sheet to a surface of a copper foil circuit include 3,3'-diaminodiphenyl sulfone, 4,4'-diaminodiphenyl sulfone, 4,4'-diamino-2,2',3,3'-tetrachlorodiphenyl methane, 4,4'-diamino-2,2',5,5'-tetrachlorodiphenyl methane, trismethylenebis(p-aminobenzoate), 2,4-diamino-3,5-diethyltoluene, 2,6-diamino-3,5-diethyltoluene, 3,5-dimethylthio-2,4-toluene diamine, 3,5-dimethylthio-2,4-toluene diamine, 3,5-dimethylthio-2,6-toluene diamine and the like. They may be used alone or in combination. Further, they may be used in combination with the above examples of the aromatic amine (c1) having high reactivity.

The dicyandiamide (c2) is used together with the above aromatic amine (c1) as a curing agent (c). The dicyandiamide (c2) is inexpensive and excellent in adhesion strength to metals and is well known as a latent curing agent.

The components (a) to (c) described above are used in the following amounts. That is, the component (b) is contained preferably in an amount of 25 to 200 parts by weight, more preferably 33 to 100 parts by weight based on 100 parts by weight of the epoxy resin (a). The total amount of the component (c1) and the component (c2) as the component (c) is preferably 0.7:1 to 1.3:1 more preferably 0.8:1 to 1.2:1 in terms of equivalent ratio to the epoxy resin (a). Due to such blending ratios, the adhesive composition of the present invention provides an adhesive having excellent adhesion strength and a laminate having soldering heat resistance and consisting of a base film or a cover lay sheet and a copper foil with the adhesive interposed therebetween.

The curing agent (c) comprises the component (c1) and the component (c2) as described above. The blending ratio of the component (c1) to the component (c2) is critical and satisfies $35/65 \leq (c1)/(c2) \leq 99/1$ in terms of molar ratio. As far as the blending ratio is within this range, the adhesive composition of the present invention provides an adhesive which can bond a cover lay sheet to a gloss surface of a copper foil from which a rustproof coating film has been removed with high strength as well as a laminate which is formed of a cover lay sheet bonded to a gloss surface of a copper foil with the adhesive interposed therebetween and which is excellent in soldering heat resistance. A more preferable molar ratio satisfies $45/55 \leq (c1)/(c2) \leq 98/2$.

The adhesive composition of the present invention may further contain a curing accelerator, an inorganic filler, a heat deterioration inhibitor or the like according to 10 application purpose in addition to the components (a) to (c).

As the curing accelerator, those having the property of enhancing reactivity with the aromatic amine (c1) and/or the dicyandiamide (c2) are used, with preferred examples thereof including amine complexes of boron trifluoride, imidazole derivatives, aromatic urea derivatives and the like.

Storage stability in B-stage is required for an adhesive used to laminate a surface of a copper foil circuit (a gloss surface of a copper foil) and a cover lay sheet in the production process of a flexible printed circuit board when the adhesive is in B-stage state.

Therefore, among the amine complexes of boron trifluoride, monoethylamine complexes of boron trifluoride and piperidine complexes of boron trifluoride are particularly preferred for use in the above adhesive. When storage stability of the adhesive in B-stage state and metal corrosion property of boron trifluoride are taken into account, the amine complex of boron trifluoride is preferably used in an amount of not more than 1.5 parts by weight, more preferably 0.1 to 1.0 part by weight, based on 100 parts by weight of the epoxy resin (a).

Commercially available products of the imidazole derivatives can be used, while when they are used for the above adhesive and storage stability in B-stage is taken into account, 2-phenyl-4-methyl imidazole, 2-phenyl-4,5-dihydroxymethyl imidazole, 2-phenyl-4-benzyl-5-hydroxymethyl imidazole, adduct of 2-methyl imidazole with isocyanuric acid, adduct of 2,3-ethyl-4-methyl imidazole with trimellitic acid and the like can be preferably used. The imidazole derivative is preferably added in an amount of 0.2 to 3.0 parts by weight based on 100 parts by weight of the epoxy resin (a) in view of storage stability.

To the adhesive composition of the present invention can be added an inorganic filler. Addition of the inorganic filler alleviates heat shock to an adhesive layer in the step of soldering an electronic or electric part to a copper foil circuit which is laminated on a base film with the cured adhesive layer interposed therebetween. This contributes to the stability of the adhesion strength of the adhesive layer and improvement of adhesion strength. Further, when a cover lay sheet is laminated on a surface of a copper foil circuit, addition of the inorganic filler to the adhesive composition of the present invention can prevent the fluidization of the adhesive layer in the B-stage state.

Preferably, the inorganic filler is excellent in electric insulating property and in the form of fine particles. Specific examples of the inorganic filler include alumina, aluminium hydroxide, molten silica, crystalline silica, super finely-ground amorphous silica, hydrophobic super finely-ground silica, talc, barium sulfate and the like. The inorganic filler is preferably contained in an amount of 10 to 100 parts by weight based on 100 parts by weight of the epoxy resin (a).

When the inorganic filler is added, a silane coupling agent is preferably used to bond the inorganic filler to the epoxy resin (a). Illustrative examples of the silane coupling agent include γ-glycidoxypropyltrimethoxysilane, γ-glycidoxypropyltriethoxysilane, γ-glycidoxypropylmethyldiethoxysilane, γ-glycidoxypropyldimethylethoxysilane, γ-mercaptopropyltrimethoxysilane, γ-aminopropyltrimethoxysilane, γ-aminopropyltriethoxysilane, γ-(β-aminoethyl)-aminopropyltrimethoxysilane, γ-anilinopropyltrimethoxysilane and the like. They are commercially available and marketed from Toray Dow Silicone Co. Ltd, Shinetsu Chemical Industry Co. Ltd, etc., for example.

When a heat deterioration inhibitor is added to the adhesive composition of the present invention, the heat deterioration of the component (b) is mainly prevented. The heat deterioration inhibitor is preferably based on hindered phenols. Addition of naphthylamine, diphenylamine, p-phenylenediamine heat deterioration inhibitors commonly used for preventing the heat deterioration of nitrile rubber to the adhesive deterioration of nitrile rubber to the adhesive composition of the present invention is not desired because most of them have an active amino group and are colored when they are reacted with the epoxy resin (a) or heat deteriorated. Preferred examples of the hindered phenolic heat deterioration inhibitor that can be added to the adhesive composition of the present invention include 4,4'-thiobis(6-t-butyl-3-methyl)phenol, 1,3,5-tris(3',5'-di-t-butyl-4-hydroxybenzyl)-s-triazine, 1,3,5-trimethyl-2,4,6-tris(3,5-di-t-butyl-4-hydroxyphenyl)benzylbenzene and the like. They may be used alone or in combination of two or more. Further, they may be used in combination with dilauryl thiodipropionate or distearyl thiodipropionate. The heat deterioration inhibitor is preferably added in an amount of 0.02 to 5% by weight of the component (c).

The adhesive composition of the present invention described above in detail can bond a polyimide film as a base film of an FPC to a mat surface of a copper foil firmly. Peel strength at 180° is as high as 1.0 to 2.5 kgf/cm when measured in accordance with JIS K6854-1977.

Further, the adhesive composition can firmly bond a polyimide film which is a cover lay sheet for covering an exposed surface (gloss surface) of a copper foil circuit to the gloss surface of the copper foil circuit irrespective of the presence of a rustproof coating film on the gloss surface. For instance, a peel strength at 180° is as high as 1.0 to 1.5 kgf/cm when measured in accordance with JIS K6854-1977.

An FPC produced using the adhesive composition of the present invention is excellent in soldering heat resistance.

According to the present invention, there is provided a flexible printed circuit board (FPC) comprising a base film such as a polyimide film and a copper circuit bonded to the base film via an adhesive layer formed by curing the adhesive composition described above. In one- or multiple-layered FPC, the gloss surface of the outermost polyimide sheet via an adhesive layer formed by curing the adhesive composition.

The base film and the mat surface of the copper circuit are bonded at a 180° peel stength of 1.0 to 2.5 Kgf/cm and the copper circuit is bonded to the cover lay sheet at a 180° peel strength of 1.0 to 1.5 Kgf/cm.

The present invention is further illustrated by the following examples. Preparation and evaluations of an adhesive in Examples and Comparative Examples were made as follows.

[Preparation of an adhesive]

1) Preparation of a component A 897.0 g of 2-butanone, 350.0 g of aluminum hydroxide (Higilite H-43M, (trade name) manufactured by Showa Denko K. K.), and 3.0 g of a silane coupling agent (SH6040 (trade name) manufactured by Toray Dow Silicone Co.) were charged into a 5-liter separable flask equipped with a stirrer and stirred vigorously to disperse them uniformly. Subsequently, 300.0 g of a brominated epoxy resin (Platherm EP13 (trade name) manufactured by Dainippon Ink and Chemicals Inc.) and 450.0 g of a brominated epoxy resin solution (EPOMIK R230M80 (trade name), manufactured by Mitsui Petrochemical Industries, Ltd) and 1800.0 g of a solution prepared by dissolving NIPOL 1072 (trade name, manufactured by Nippon Zeon Co.) in 2-butanone in a solid content concentration of 17.0% by weight were added and dissolved. The resulting solution was filtered with a 40 $\mu$m filter to produce a component A.

The brominated epoxy resin Patherm EP13, the brominated epoxy resin solutions EPOMIK R230M80 and NIPOL 1072 had the following compositions and properties.

(i) brominated epoxy resin Patherm EP13

This resin is a brominated epoxy resin which is a diglycidyl ether of tetrabromo bisphenol A. It has an epoxy equivalent of 656, a bromine content of 50% by weight and two epoxy groups per molecule.

(ii) brominated epoxy resin solution EPOMIK R230M80

This is a butanone solution containing 80% by weight of a solid content (brominated epoxy resin). The brominated epoxy resin (solid component) is a brominated epoxy resin which is a diglycidyl ether of brominated bisphenol A, and has an epoxy equivalent of 499, a bromine content of 19% by weight and two epoxy groups per molecule.

(iii) NIPOL 1072

This is a butadiene-acrylonitrile copolymer rubber containing a carboxyl group. The content of units derived from carboxyl group-containing monomers is 4 mol % and the content of units derived from acrylonitrile is 27% by weight. Its Mooney viscosity ($ML_{1+4}$, 100° C.) is 45.

2) Preparation of a component B

A rotor is placed into a 50-ml conical flask equipped with a ground stopper, predetermined amounts of aromatic amine and dicyandiamide were charged to the flask, and 0.30 g of boron trifluoride monoethylamine (abbreviated as $BF_3 \cdot MEA$) was further added. Subsequently, a mixed solvent of methylcellosolve and N,N-dimethylformamide (1/1 in weight ratio) was added such that the total amount of it and the three components became 38.00 g, stirred and dissolved. The resulting solution was filtered with a 350-mesh filter to form a component B.

3) Preparation of an adhesive composition 5.00 g of a component B solution obtained in 2) above was added to 50.00 g of the component A obtained in 1) above, and mixed thoroughly to prepare an adhesive.

[Evaluation of an adhesive]

The adhesive prepared above was applied to a 25 $\mu$m thick polyimide film (Kapton 100H (trade name) manufactured by E. I. Du Pont de Nemours & Co.) such that the thickness of a dried adhesive layer was 30 $\mu$M. Then, the polyimide film was dried in a forced circulating hot air oven heated at 130° C. for 2.5 minutes to form an adhesive layer in a B-stage state. The adhesive layer in the B-stage state was laminated on a surface to be bonded of a rolled copper foil, and then cured under pressure (about 30 kgf/cm$^2$) with a press heated at 160° C. for 1 hour to prepare a laminate sample in which the polyimide film and the rolled copper foil were laminated with the cured adhesive layer interposed therebetween.

The surface to be bonded of the rolled copper foil is a gloss surface having a rustproof coating film or a gloss surface obtained by removing a rustproof coating film from a gloss surface of the rolled copper foil by treating the rolled copper foil with an aqueous solution of 5% dilute sulfuric acid for 30 seconds.

Adhesion strength and soldering heat resistance tests were conducted on the thus prepared laminate sample in accordance with the following methods.

(1) Adhesion strength A

The laminate sample was cut into 1.0 cm wide pieces. The copper foil of each of the pieces was stretched in a direction of 180° in accordance with JIS K6854-1977 and measured for a peel strength in the direction of 180°.

(2) Adhesion strength B

This adhesion strength was measured in accordance with IPC standard No.2.4.9. That is, the laminate sample was etched to form a 3 mm wide copper foil. The copper foil was stretched in a direction of 90° using a Free Wheeling Rotary Drum in accordance with Method A and measured for a peel strength in the direction of 90°.

(3) Soldering heat resistance A

The laminate sample was left in an air-conditioned room (23° C., 60% RH) for 24 hours (treatment condition: C-24/23/60) and cut into 2 cm square pieces. Each of the pieces was immersed in a solder bath heated at a predetermined temperature for 10 seconds and observed to check the presence of swelling, permeation of solder from end portions and color changes. This operation was repeated by elevating the temperature of the solder bath to find the highest temperature at which none of the above defects occurred.

(4) Soldering heat resistance B

The above procedure of preparing the laminate sample was repeated except that the adhesive layer in a B-stage state was formed on the polyimide film and then fifty 5-mm diameter holes were punched in the film. This laminate sample was left in the air-conditioned room (23° C., 60% RH) for 24 hours (treatment condition: C-24/23/60), and thereafter, Flux (trade name: AUTOFLUX JS-64MS, manufacturer: Sanei Chemical Co.) was applied to the copper foil in each of the holes and immersed in a solder bath heated at 260° C. or 280° C. for 10 seconds 30 to 60 seconds after the application. It was checked through a stereoscopic microscope whether the solder permeated or not into the space between the copper foil and the cured adhesive layer of the laminated sample from the periphery of the hole and the number of holes into which the solder permeated was counted.

REFERENCE EXAMPLES 1 TO 4

Four kinds of component Bs (K1 to K4) shown in Table 1 were prepared and combined with the component A to prepare adhesives which were evaluated for adhesion performance. Figures in Table 1 represent amounts to be used (unit: gram). These use either aromatic amine or dicyandiamide. A rolled copper foil whose surface was subjected to a rustproof treatment with chromium/zinc was used directly as a copper foil. Results are shown in Table 2.

TABLE 1

|  | Component B | | | | (Amount: g) |
|---|---|---|---|---|---|
|  | K1 | K2 | K3 | K4 | |
| D | 2.48 | — | — | — | |
| Q | — | 9.90 | — | — | |
| T | — | — | 9.26 | — | |
| R | — | — | — | 7.32 | |
| $BF_3$.MEA | 0.30 | 0.30 | 0.30 | 0.30 | |
| Solvent | 35.22 | 27.80 | 28.44 | 30.38 | |

TABLE 2

|  | Ref. Ex. 1 | Ref. Ex. 2 | Ref. Ex. 3 | Ref. Ex. 4 |
|---|---|---|---|---|
| Component B | K1 | K2 | K3 | K4 |
| Adhesion strength A (in 180° direction) (kgf/cm) | 1.2 | 1.5 | 2.0 | 1.7 |
| Adhesion strength B (in 90° direction) (kgf/cm) | 1.3 | 1.9 | 2.3 | 2.0 |
| Soldering heat resistance A (°C.) | 300 | 320 | above 340 | above 340 |

It is understood from the results of Table 2 that all the adhesives provide the gloss surface of the rolled copper foil having a rustproof coating film, with excellent adhesion strength and soldering heat resistance.

COMPARATIVE EXAMPLES 1 TO 4

A rolled copper foil was treated with an aqueous solution of 5% dilute sulfuric acid for 30 seconds to remove a rustproof coating film, bonded using the same four kinds of component Bs as in Reference Examples and evaluated for performance. Results are shown in Table 3.

TABLE 3

|  | Comp. Ex. 1 | Comp. Ex. 2 | Comp. Ex. 3 | Comp. Ex. 4 |
|---|---|---|---|---|
| Component B | K1 | K2 | K3 | K4 |
| Adhesion strength A (in 180° direction) (kgf/cm) | 0.6 | 0.6 | 0.3 | 0.4 |
| Adhesion strength B (in 180° direction) (kgf/cm) | 0.9 | 1.1 | 0.9 | 1.0 |
| Soldering heat resistance A (°C.) | 255 | 260 | 265 | 260 |

It is understood from the results of Table 3 that the adhesives of Comparative Examples 1 to 4 exhibited extremely low adhesion strength and soldering heat resistance with respect to the rolled copper foil treated with dilute sulfuric acid in spite that the same adhesives as in Reference Examples 1 to 4 and Comparative Examples 1 to 4 were used.

When fractured surfaces at the time of measurement of adhesion strength were observed, a cohesive failure occurred in all the adhesives of Reference Examples 1 to 4 irrespective of pull direction, whereas an interfacial failure from the copper foil occurred in all the adhesives of Comparative Examples.

EXAMPLES 1 TO 9 AND COMPARATIVE EXAMPLE 5

Component BS (K5 to K13) were prepared using 4,4'-diamino-2,2',3,3'-tetrachlorodiphenylmethane (abbreviated as Q) as the component (c1) and dicyandiamide (abbreviated as D) as the component (c2) in amounts shown in Tables 4 and 5. These component Bs were combined with the component A to prepare adhesives. These adhesives were used to bond the gloss surface of a rolled copper foil which was treated with dilute sulfuric acid to remove a rustproof coating film and tested in the same manner as in Comparative Examples 1 to 4. Results are shown in Table 6.

TABLE 4

|  | Component B (Amount: g) | | | | |
|---|---|---|---|---|---|
|  | K5 | K6 | K7 | K8 | K9 |
| Q | 2.98 | 3.97 | 4.96 | 5.94 | 7.99 |
| D | 1.74 | 1.49 | 1.24 | 0.99 | 0.50 |
| $BF_3$.MEA | 0.30 | 0.30 | 0.30 | 0.30 | 0.30 |
| Solvent | 32.98 | 32.24 | 31.50 | 30.77 | 29.21 |
| Q/D molar ratio | 30/70 | 40/60 | 50/50 | 60/40 | 80/20 |

Q: 4,4-diamino-2,2',3,3'-tetrachlorodiphenylmethane
D: dicyandiamide
$BF_3$.MEA: monoethylamine complex of boron trifluoride
Q/D: molar ratio of aromatic amine Q to dicyandiamide D

TABLE 5

|  | Component B (Amount: g) | | | |
|---|---|---|---|---|
|  | K10 | K11 | K12 | K13 |
| Q | 8.99 | 9.59 | 9.792 | 9.892 |
| D | 0.25 | 0.12 | 0.050 | 0.025 |
| $BF_3$.MEA | 0.30 | 0.30 | 0.300 | 0.300 |
| Solvent | 28.46 | 27.99 | 27.858 | 27.783 |
| Q/D molar ratio | 90/10 | 95/5 | 98/2 | 99/1 |

Q: 4,4-diamino-2,2',3,3'-tetrachlorodiphenylmethane
D: dicyandiamide
$BF_3$.MEA: monoethylamine complex of boron trifluoride
Q/D: molar ratio of aromatic amine Q to dicyandiamide D

TABLE 6

|  | Component B | Adhesion strength A (in 180° direction) (kgf/cm) | Adhesion strength B (in 90° direction) (kgf/cm) | Soldering heat resistance A (°C.) (C-24/23/60) |
|---|---|---|---|---|
| Comp. Ex. 5 | K5 | 0.8 | 1.3 | 275 |
| Ex. 1 | K6 | 1.0 | 1.5 | 295 |
| Ex. 2 | K7 | 1.3 | 1.5 | 300 |
| Ex. 3 | K8 | 1.3 | 1.5 | 300 |
| Ex. 4 | K9 | 1.2 | 1.4 | 310 |
| Ex. 5 | K10 | 1.3 | 1.4 | 315 |
| Ex. 6 | K11 | 1.3 | 1.5 | 320 |
| Ex. 7 | K12 | 1.4 | 1.6 | 315 |
| Ex. 8 | K13 | 1.0 | 1.4 | 315 |

Fractured portions at the time of measurement of adhesion strength were caused by the cohesion failure of the adhesives in Examples 2 to 7 and a combination of cohesion failure and interfacial failure of the adhesives in Examples 1 and 8. On the other hand, an interfacial failure from copper occurred in Comparative Example 5.

Subsequently, the adhesives of Examples 1 to 8 and Comparative Examples 1, 2 and 5 were evaluated for soldering heat resistance B at 260° C. and 280° C. Results are shown in Table 7.

TABLE 7

|  | Number of holes into which solder permeated (260° C.) | Occurrence ratio (%) | Number of holes into which solder permeated (280° C.) | Occurrence ratio (%) |
|---|---|---|---|---|
| Comp. Ex. 1 | 15/50 | 30 | 38/50 | 76 |
| Comp. Ex. 2 | 30/50 | 60 | 43/50 | 86 |
| Comp. Ex. 5 | 6/50 | 12 | 28/50 | 56 |
| Ex. 1 | 0/50 | 0 | 1/50 | 2 |
| Ex. 2 | 0/50 | 0 | 2/50 | 4 |
| Ex. 3 | 0/50 | 0 | 0/50 | 0 |
| Ex. 4 | 0/50 | 0 | 0/50 | 0 |
| Ex. 5 | 0/50 | 0 | 0/50 | 0 |
| Ex. 6 | 0/50 | 0 | 2/50 | 4 |
| Ex. 7 | 3/50 | 6 | 14/50 | 28 |

Note: In the column for the number of holes into which solder permeates, denominators represent the number of holes tested and numerators the number of holes into which solder permeates.

It is evident from the results of Table 7 that the adhesives of Examples 1 to 7 are smaller in the number of holes into which solder permeates than the adhesives of Comparative Examples.

EXAMPLES 8 TO 11

Four kinds of component Bs (K14 to K17) were prepared using 4,4'-diaminodiphenyl sulfone (abbreviated as R), 3,3'-diaminodiphenyl sulfone (S), trismethylenebis(4-aminobenzoate) (T) or 3,5-diethyltoluene-2,4-diamine (U) as the aromatic amine of the component (c1) and dicyandiamide (D) as the component (d) in amounts shown in Table 8 and combined with the component A to prepare adhesives. The adhesives were used to bond the gloss surface of a rolled copper foil which was treated with dilute sulfuric acid to remove a rustproof coating film and subjected to adhesion performance and soldering heat resistance tests. Results are shown in Tables 9 and 10.

TABLE 8

|  | Component B (Amount: g) | | | |
|---|---|---|---|---|
|  | K14 | K15 | K16 | K17 |
| Component (c1) | | | | |
| R | 7.09 | — | — | — |
| S | — | 6.19 | — | — |
| T | — | — | 6.46 | — |
| U | — | — | — | 4.24 |
| Component (c2) | | | | |
| D | 0.10 | 0.37 | 0.74 | 0.50 |
| $BF_3$.MEA | 0.30 | 0.30 | 0.30 | 0.30 |
| Solvent | 30.51 | 31.14 | 30.50 | 32.96 |
| (c1)/(c2) molar ratio | 96/4 | 85/15 | 70/30 | 80/20 |

Note:
R: 4,4'-diaminodiphenyl sulfone
S: 3,3'-diaminodiphenyl sulfone
T: trismethylene bis(4-aminobenzoate)
U: 3,5-diethyltoluene-2,4-diamine (containing about 20% of 2,6-diamine)
D: dicyandiamide
$BF_3$.MEA: monoethylamine complex of boron trifluoride
(c1)/(c2): molar ratio of component (c1) to component (c2)

TABLE 9

|  | Component B | Adhesion strength A (in 180° direction) (kgf/cm) | Adhesion strength B (in 90° direction) (kgf/cm) | Soldering heat resistance A (°C.) (C-24/23/60) |
|---|---|---|---|---|
| Ex. 8 | K14 | 1.4 | 1.9 | 310 |
| Ex. 9 | K15 | 1.4 | 1.8 | 305 |
| Ex. 10 | K16 | 1.3 | 1.8 | 310 |
| Ex. 11 | K17 | 1.3 | 1.6 | 300 |

TABLE 10

Soldering heat resistance B

|  | Number of holes into which solder permeated (260° C.) | Occurrence ratio (%) | Number of holes into which solder permeated (280° C.) | Occurrence ratio (%) |
|---|---|---|---|---|
| Ex. 8 | 0/50 | 0 | 0/50 | 0 |
| Ex. 9 | 0/50 | 0 | 0/50 | 0 |
| Ex. 10 | 0/50 | 0 | 0/50 | 0 |
| Ex. 11 | 0/50 | 0 | 2/50 | 4 |

It is understood from the results of Tables 9 and 10 that a combination of the aromatic amine and the dicyandiamide provides the adhesive composition of the present invention with excellent adhesion performance and a laminate having excellent soldering heat resistance.

EXAMPLES 12 TO 14

The adhesives of Example 6 (using component B K11), Example 9 (using component B K15) and Example 11 (using component B K17) were used to bond a polyimide film to a mat surface of a rolled copper foil having a rustproof coating film and evaluated for adhesion performance. Results are shown in Table 11.

TABLE 11

Evaluation of adhesion performance

|  | Component B | Adhesion strength A (in 180° direction) (kgf/cm) | Adhesion strength B (in 90° direction) (kgf/cm) | Soldering heat resistance A (°C.) (C-24/23/60) |
|---|---|---|---|---|
| Ex. 12 | Same as Ex. 6 | 1.3 | 1.5 | above 340 |
| Ex. 13 | Same as Ex. 9 | 1.5 | 1.9 | above 340 |
| Ex. 14 | Same as Ex. 11 | 1.5 | 1.6 | above 340 |

As shown in Table 11, each example provides almost the same adhesion strength as that of the gloss surface of the rolled copper foil treated with dilute sulfuric acid regardless of pull direction. When fractured surfaces at the time of measurement of adhesion strength are observed, they are all caused by the cohesion failure of the adhesives and the same result is obtained regardless of the front and back sides of the copper foil surface. Solder heat resistance (A) is extremely good at 340° C. or more.

EXAMPLE 15

A component A was prepared using a solution of carboxylated hydrogenated nitrile rubber (content of units derived from monomers having a carboxyl group: 2.4 mol %, content of units derived from acrylonitrile: 34 mol %, Mooney viscosity: 95) in 17.0% by weight of 2-butanone in place of the 2-butanone solution NIPOL1072 of the component A used in Examples 1 to 14. This component A and the component B K11 were combined to prepare an adhesive. The adhesive was used to bond a polyimide film to a mat surface of a rolled copper foil having a rustproof coating film and a gloss surface of a rolled copper foil which was treated with dilute sulfuric acid to remove a rustproof coating film and evaluated for adhesion performance. Results are shown in Table 12.

TABLE 12

|  | Adhesion strength A (in 180° direction) (kgf/cm) | Adhesion strength B (in 90° direction) (kgf/cm) | Soldering heat resistance A (°C.) (C-24/23/60) | Soldering heat resistance A (280° C.) (C-24/23/60) |
|---|---|---|---|---|
| Copper foil mat surface | 1.2 | 1.4 | 315 | not tested |
| Copper foil gloss surface | 1.1 | 1.4 | 300 | 0/50 |

EXAMPLES 16 to 18

Samples prepared by applying the adhesives of Examples 2, 6 and 8 to polyimide films (Kapton 100H) and drying the adhesives in a forced circulating hot air oven heated at 130° C. for 2.5 minutes were left in an air-conditioned room (23° C., 60% RH) for 30 days. These samples were bonded to the gloss surfaces of rolled copper foils which were treated with dilute sulfuric acid to remove rustproof coating films and evaluated for adhesion performance after storage treatment. Results are shown in Table 13.

TABLE 13

|  | Component B | Adhesion strength B (in 90° direction) (kgf/cm) | Soldering heat resistance A (°C.) (C-24/23/60) |
|---|---|---|---|
| Ex. 16 | Same as Ex. 2 | 1.5 | 305 |
| Ex. 17 | Same as Ex. 6 | 1.4 | 320 |
| Ex. 18 | Same as Ex. 8 | 2.0 | 310 |

As is evident from the results of Table 13, these examples exhibit almost the same results as those before standing for 30 days and good storage stability.

What is claimed is:

1. An adhesive composition for use in a flexible printed circuit board, comprising:
   (a) an epoxy resin having substantially at least two epoxy groups per molecule;
   (b) 33 to 200 parts by weight based on 100 parts by weight of the epoxy resin (a) of at least one compound selected from carboxyl group-containing nitrile rubber and carboxyl group-containing hydrogenated nitrile rubber; and
   (c) a curing agent which comprises an aromatic amine having substantially at least two primary amino groups per molecule (c1) and dicyandiamide (c2), the molar ratio of the aromatic amine (c1) to the dicyandiamide (c2) being $35/65 \leq (c1)/(c2) \leq 99/1$, wherein the total amount of aromatic amine (c1) and dicyandiamide (c2) is used in an equivalent ratio of 0.7:1 to 1.3:1 with respect to the epoxy resin (a).

2. The adhesive composition of claim 1, wherein the epoxy equivalent of the epoxy resin (a) is in the range of 80 to 2,000.

3. The adhesive composition of claim 1, wherein the molar ratio of the aromatic amine (c1) to the dicyandiamide (c2) is $45/55 \leq (c1)/(c2) \leq 98/2$.

4. The adhesive composition of claim 1, which contains a curing accelerator.

5. The adhesive composition of claim 4, which contains an amine complex of boron trifluoride as the curing accelerator.

6. The adhesive composition of claim 1, which contains an inorganic filler and a heat deterioration inhibitor.

7. The adhesive composition of claim 2, wherein the epoxy equivalent of the epoxy resin (a) is in the range of 100 to 1000.

8. The adhesive composition of claim 1, wherein the amount of carboxyl group containing nitrile rubber or carboxyl group containing hydrogenated nitrile rubber is 33 to 100 parts by weight based on 100 parts by weight of the epoxy resin (a).

9. The adhesive composition of claim 1, wherein the total amount of the aromatic amine (c1) and the dicyandiamide (c2) is used in an equivalent ratio of 0.8:1 to 1.2:1 with respect to the epoxy resin (a).

10. An adhesive composition for use in a flexible printed circuit board, comprising:
    (a) an epoxy resin having substantially at least two epoxy groups per molecule in at least 98% by weight of the total amount of molecules;
    (b) 33 to 200 parts by weight based on 100 parts by weight of the epoxy resin (a) of at least one compound selected from carboxyl group-containing nitrile rubber and carboxyl group-containing hydrogenated nitrile rubber;
    (c) a curing agent which comprises an aromatic amine having substantially at least two primary amino groups per molecule (c1) and dicyandiamide (c2), the molar ratio of the aromatic amine (c1) to the dicyandiamide (c2) being $35/65 \leq (c1)/(c2) \leq 99/1$, wherein the total amount of aromatic amine (c1) and dicyandiamide (c2) is used in an equivalent ratio of 0.7:1 to 1.3:1 with respect to the epoxy resin (a);
    (d) a curing accelerator; and
    (e) an inorganic filler and a heat deterioration inhibitor.

* * * * *